(12) United States Patent
Lin et al.

(10) Patent No.: US 11,203,522 B2
(45) Date of Patent: *Dec. 21, 2021

(54) SIDEWALL STOPPER FOR MEMS DEVICE

(71) Applicant: Taiwan Semiconductor Manufacturing Co., Ltd., Hsin-Chu (TW)

(72) Inventors: Shih-Wei Lin, Taipei (TW); Chang-Ming Wu, New Taipei (TW); Ting-Jung Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/990,092

(22) Filed: Aug. 11, 2020

(65) Prior Publication Data

US 2020/0369511 A1 Nov. 26, 2020

Related U.S. Application Data

(63) Continuation of application No. 16/392,844, filed on Apr. 24, 2019, now Pat. No. 10,766,763.

(Continued)

(51) Int. Cl.
*B81B 3/00* (2006.01)
*B81B 1/00* (2006.01)
*B81C 1/00* (2006.01)

(52) U.S. Cl.
CPC .............. *B81B 3/001* (2013.01); *B81B 1/004* (2013.01); *B81B 3/0021* (2013.01);
(Continued)

(58) Field of Classification Search
CPC ... H04R 3/00; H04R 1/02; H04R 9/06; H04R 1/08; H04R 1/28; H04R 1/40;
(Continued)

(56) References Cited

U.S. PATENT DOCUMENTS 7,902,615 B2 3/2011 Schlosser et al.
9,630,837 B1 4/2017 Chu et al.
(Continued)

OTHER PUBLICATIONS

Notice of Allowance dated May 1, 2020 for U.S. Appl. No. 16/392,844.

*Primary Examiner* — Alexander Krzystan
*Assistant Examiner* — Julie X Dang
(74) *Attorney, Agent, or Firm* — Eschweiler & Potashnik, LLC

(57) ABSTRACT

The present disclosure relates to a microphone. In some embodiments, the microphone may comprise a diaphragm, a backplate, and a sidewall stopper. The diaphragm has a venting hole disposed therethrough. The backplate is disposed over and spaced apart from the diaphragm. The sidewall stopper is disposed along a sidewall of the diaphragm exposing to the venting hole. Thus, the sidewall stopper is not limited by a distance between the movable part and the stable part of the microphone. Also, the sidewall stopper does not alternate the shape of movable part, and thus will less likely introduce crack to the movable part. In some embodiments, the sidewall stopper may be formed like a sidewall stopper by a self-alignment process, such that no extra mask is needed.

20 Claims, 8 Drawing Sheets

Related U.S. Application Data

(60) Provisional application No. 62/738,077, filed on Sep. 28, 2018.

(52) U.S. Cl.
CPC ...... *B81C 1/00158* (2013.01); *B81C 1/00531* (2013.01); *B81C 1/00571* (2013.01); *B81B 2201/0257* (2013.01); *B81B 2203/0127* (2013.01); *B81B 2203/053* (2013.01)

(58) Field of Classification Search
CPC . H04R 29/00; H04R 9/02; H04R 1/10; H04R 7/04; H04R 7/12; H04R 7/18; H04R 17/00; H04R 19/04; B81B 3/00; B81B 7/00; B81B 7/02; B06B 1/02; B29C 64/00; B32B 37/12; B32B 37/18; B32B 7/12; B33Y 80/00; B60R 11/02; B60R 13/02; B60R 16/023
See application file for complete search history.

(56) References Cited

U.S. PATENT DOCUMENTS

| | | | |
|---|---|---|---|
| 9,967,679 | B2 | 5/2018 | Krumbein et al. |
| 10,766,763 | B2* | 9/2020 | Lin .................. B81B 1/004 |
| 2002/0071170 | A1 | 6/2002 | Miller et al. |
| 2008/0232615 | A1 | 9/2008 | Song et al. |
| 2012/0139065 | A1 | 6/2012 | van Beek et al. |
| 2014/0264653 | A1 | 9/2014 | Cheng et al. |
| 2015/0146906 | A1 | 5/2015 | Je et al. |
| 2015/0230011 | A1* | 8/2015 | Inoue .................. H04R 1/00 381/162 |
| 2016/0221822 | A1* | 8/2016 | Krumbein ......... H04R 19/005 |
| 2016/0229692 | A1* | 8/2016 | Lin .................. B81C 1/00238 |
| 2016/0304337 | A1* | 10/2016 | Miao ................ H04R 31/003 |
| 2016/0332867 | A1 | 11/2016 | Tseng et al. |

* cited by examiner

SIDEWALL STOPPER FOR MEMS DEVICE

REFERENCE TO RELATED APPLICATIONS

This application is a Continuation of U.S. application Ser. No. 16/392,844, filed on Apr. 24, 2019, which claims the benefit of U.S. Provisional Application No. 62/738,077, filed on Sep. 28, 2018. The contents of the above-referenced patent applications are hereby incorporated by reference in their entirety.

BACKGROUND

Microelectromechanical systems (MEMS) devices, such as accelerometers, pressure sensors, and microphones, have found widespread use in many modern day electronic devices. MEMS devices may have a movable part, that is used to detect a motion, and convert the motion to electrical signal. For example, MEMS accelerometers and microphones are commonly found in automobiles (e.g., in airbag deployment systems), tablet computers, or in smart phones. A MEMS accelerometer includes a movable part that transfers the accelerating movement to an electrical signal. A microphone includes a movable membrane that transfers the sound to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
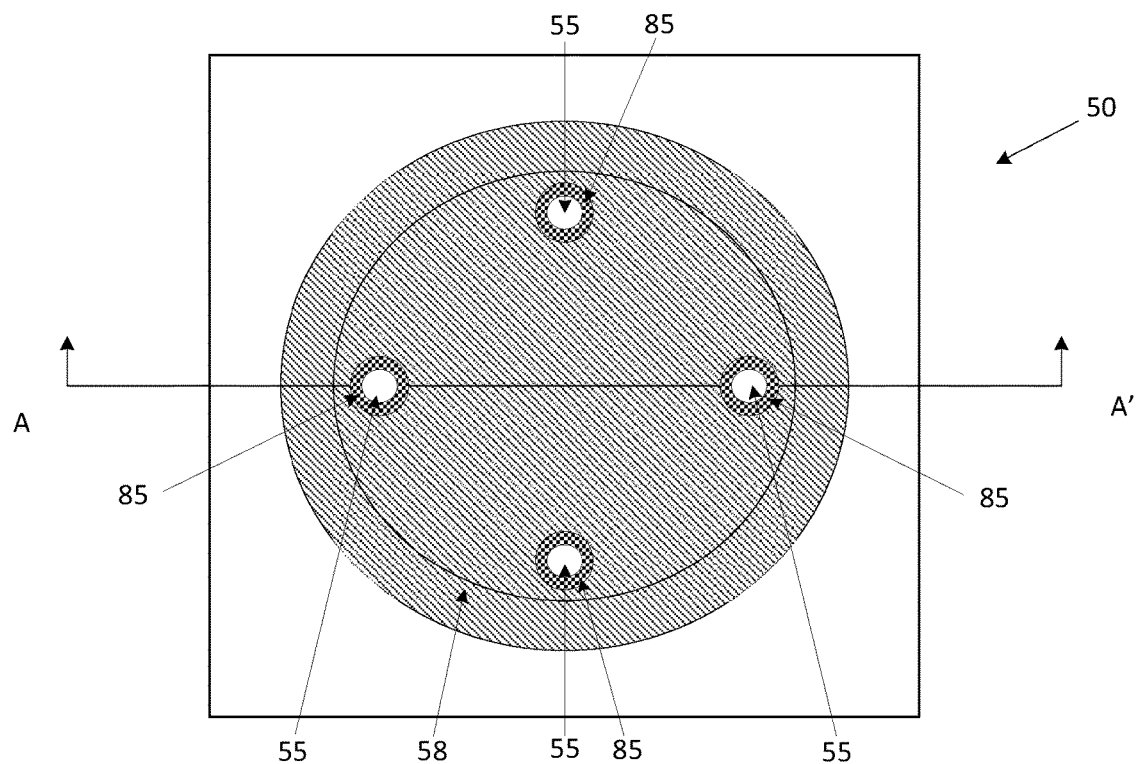
FIG. 1 is a top view of a diaphragm in a MEMS microphone with a sidewall stopper in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Many micro-electromechanical system (MEMS) devices can be manufactured using semiconductor device fabrication methods. For MEMS devices with movable parts, stoppers are commonly attached on those movable parts, or corresponding stable or movable parts of the MEMS device that could possibly be contacted by the movable parts, such that the MEMS device is protected from damage, and/or the movable parts are prevented from stiction to the corresponding stable or movable parts.

One approach to fabricate a stopper for a MEMS device is by integrating protrusion structures to the stable or movable parts of the MEMS device. For example, forming an extra "tip" or a "protrusion" on the movable membrane or the corresponding location of the stable part that could contact the movable membrane. One problem of this approach is that the MEMS device can crack easily due to the non-flat membrane topography induced by the protrusion structures. Increasing thickness of the movable membrane may help to alleviate this issue, but the detecting sensitivity would suffer. Also, a height of the stopper cannot exceed a distance between the movable membrane and the stable part. This dimension limitation becomes a more serious issue when a small device footprint is needed.

In view of above shortcomings, the present disclosure is directed to a MEMS device including a sidewall stopper, and an associated method of formation. As an example application, the MEMS device can be a microphone. The microphone includes a substrate having an opening and a diaphragm facing the opening in the substrate. The diaphragm includes at least one venting hole. A sidewall stopper is disposed along sidewalls of the venting hole of the diaphragm. In some embodiments, an upper portion of the sidewall stopper contacts a top surface of the diaphragm, and a lower portion of the sidewall stopper contacts a bottom surface of the diaphragm. The upper portion and the lower portion of the sidewall stopper may clamp the diaphragm therebetween. The sidewall stopper is attached to an edge of a movable part of the MEMS device (for example, a perimeter edge of the venting hole of the microphone's diaphragm), and thus is not limited by a distance between the movable part and the stable part. Also, the sidewall stopper does not alternate the shape of movable part, and thus will less likely introduce crack to the movable part. In some embodiments, the sidewall stopper may be formed like a sidewall stopper by a self-alignment process, such that no extra mask is needed.

Figure 2:
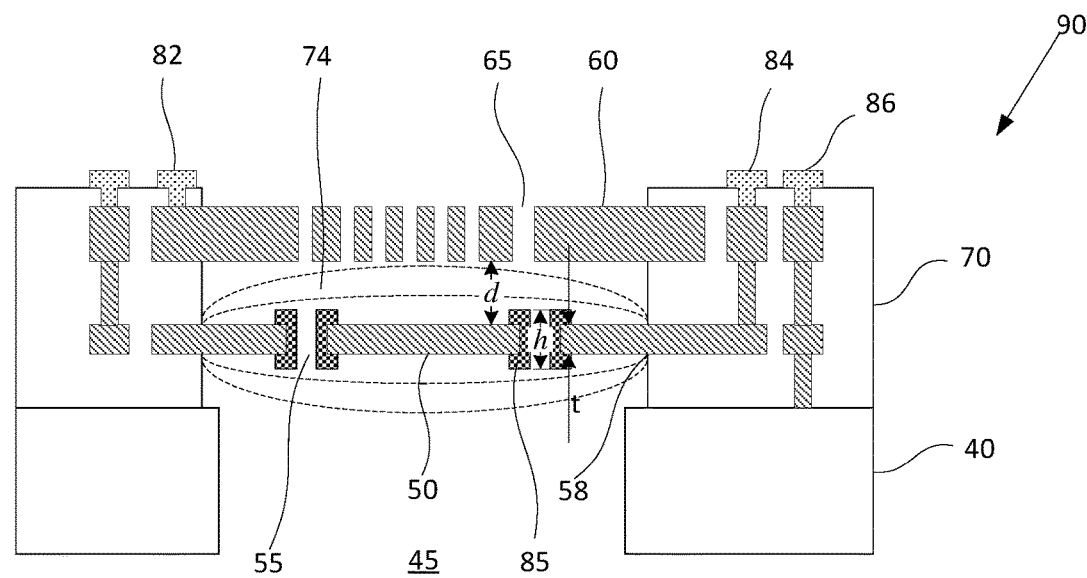
FIG. 2 is a cross-section view showing a MEMS microphone with a sidewall stopper in accordance with some embodiments.

FIG. 1 and FIG. 2 show examples of MEMS devices including a MEMS microphone 90 fabricated on a substrate 40. As shown in FIG. 2, the MEMS microphone 90 includes a backplate 60 and a diaphragm 50 spaced apart from the backplate 60. Both the backplate 60 and the diaphragm 50 can be electrically conductive, which form a capacitive element. An electrical contact 82 is electrically connected to the backplate 60 and forms a first terminal for the capacitive element, and an electrical contact 84 is electrically connected to the diaphragm 50 and forms a second terminal for the capacitive element. FIG. 1 is a top view of the diaphragm 50 of the MEMS microphone 90 in FIG. 2. The cross section A-A' of the diaphragm 50 is illustrated in FIG. 2. The diaphragm 50 includes multiple venting holes 55 distributed on the diaphragm 50 (e.g., venting holes as shown or a different amount with varied dimensions). The diaphragm 50 also includes one or more anchor areas 58 located near a boundary of the diaphragm 50. The anchor areas 58 allow the boundary of the diaphragm 50 to be fixed relative to the backplate 60 and allow gaps between the diaphragm 50 and the backplate 60 to be changed at other locations on the diaphragm at some distance away from the anchor areas 58, for example, at the center of the diaphragm 50. The diaphragm 50 is deformable by energy of sound waves to make the diaphragm 50 bend towards or away from the backplate 60, as the sound waves exert pressures on the diaphragm 50 through an opening 45 in the substrate 40. The backplate 60 has multiple open areas 65. There is an air volume space 74 between the diaphragm 50 and the backplate 60. Air can get out of or get into the air volume space 74 through the air passages formed by the open areas 65 on the backplate 60 and/or by the venting holes 55 on the the diaphragm 50, as the diaphragm 50 bends towards or away from the backplate 60. The bending movement of the diaphragm 50 relative to the backplate 60 caused by the sound waves changes the capacitance of the capacitive element between the diaphragm 50 and the backplate 60. Such change of the capacitance can be measured with the electrical contact 82 and the electrical contact 84.

FIG. 1 is a top view of the diaphragm 50 of the MEMS microphone 90 in FIG. 2. The cross section A-A' of the diaphragm 50 is illustrated in FIG. 2. The diaphragm 50 includes multiple venting holes 55 distributed on the diaphragm 50 (e.g., venting holes as shown or more). The diaphragm 50 also includes one or more anchor areas 58 located near a boundary of the diaphragm 50.

As shown by FIG. 1 and FIG. 2, a sidewall stopper 85 is disposed along a perimeter edge and a sidewall of the venting hole 55 of the diaphragm 50. In some embodiments, an upper portion of the sidewall stopper 85 contacts a top surface of the diaphragm 50, and a lower portion of the sidewall stopper 85 contacts a bottom surface of the diaphragm 50. The upper portion and the lower portion of the sidewall stopper 85 may clamp the diaphragm 50 therebetween. Thus, the sidewall stopper 85 extends vertically above and below the diaphragm 50 and thus is not limited by a distance between the diaphragm 50 and the backplate 60. In some embodiments, a vertical height h of the diaphragm 50 may be greater than a distance d between the diaphragm 50 and the backplate 60 when the diaphragm 50 locates at a relax position. A relax position of the diaphragm 50 is a position when the diaphragm 50 is not bended, moved, or deformable due to the energy of sound waves. The sidewall stopper 85 prevents stiction between the diaphragm 50 and the backplate 60.

Figure 3:
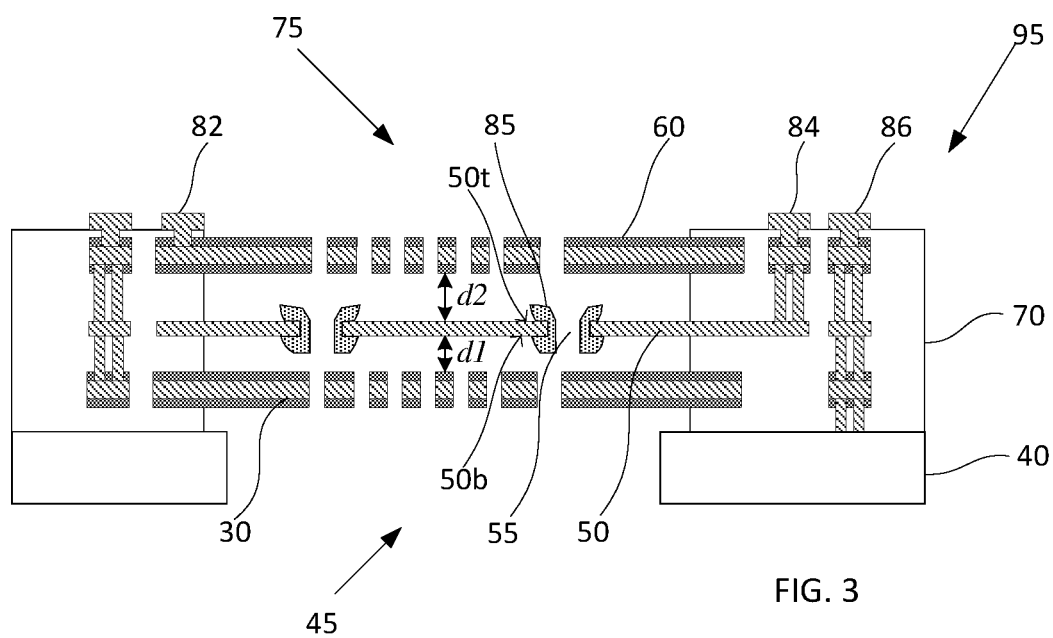
FIG. 3 is a cross-section view of a MEMS microphone with a sidewall stopper in accordance with some alternative embodiments, the MEMS microphone having dual composite backplates.

FIG. 3 shows a cross-section view of a MEMS device 95 with a sidewall stopper 85. In some embodiments, the MEMS device 95 comprises a substrate 40. In some embodiments, the substrate 40 can be a monocrystalline silicon substrate or a semiconductor-on-insulator (SOI) substrate (e.g., silicon on insulator substrate). For example, the substrate 40 can be silicon, glass, silicon dioxide, aluminum oxide, or a combination thereof. In some embodiments, CMOS circuit can be fabricated on a silicon substrate. The substrate 40 has an opening 45 disposed through the substrate 40. A diaphragm 50 is disposed over the substrate 40 and faces the opening 45 of the substrate 40. The diaphragm 50 has an opening disposed through the diaphragm. A sidewall stopper 85 is disposed along an edge perimeter of the opening of the diaphragm. The sidewall stopper 85 extends upwardly to exceed a top surface 50$t$ of the diaphragm 50 and extends downwardly to exceed a bottom surface 50$b$ of the diaphragm 50. In some embodiments, the opening of the diaphragm 50 is a venting hole 55 with a cylinder shape. The sidewall stopper 85 may have a ring shape that continuously extends along a perimeter of the opening of the diaphragm 50. The sidewall stopper 85 may also laterally extend across an edge of the opening of the diaphragm. Thus an upper portion of the sidewall stopper 85 contacts a top surface of the diaphragm 50 and a lower portion of the sidewall stopper 85 contacts a bottom surface of the diaphragm 50. The upper portion and the lower portion of the sidewall stopper 85 clamp the diaphragm 50 therebetween. In some embodiments, the sidewall stopper 85 comprises silicon nitride. In some alternative embodiments, the sidewall stopper 85 comprises polysilicon.

In some embodiments, the diaphragm 50 may include multiple venting holes with the same or different dimensions to balance a first pressure at one side of the diaphragm 50 (e.g., the side near the opening 45) with a second pressure at the other side of the diaphragm 50 (e.g., the side near the second backplate 60). Such balancing of the two pressures can decrease the chance of breaking the diaphragm 50 when a large air pressure is present at a location near the opening 45 of the diaphragm 50. The diaphragm 50 may also include some other openings disposed partially or through the diaphragm 50. The sidewall stopper disclosed above may be clamped on the edges of all those varies openings.

In some embodiments, the MEMS device 95 further comprises a first backplate 30 disposed between the diaphragm 50 and the substrate 40 and facing the opening 45 of the substrate 40. The MEMS device 95 may further comprise a second backplate 60 disposed over the diaphragm 50. The diaphragm 50 is spaced apart from the first backplate 30 by a first distance d1 and spaced apart from the second backplate 60 by a second distance d2. In some embodiments, the diaphragm 50 and the first backplate 30 form two conductive terminals of a first capacitive element; the diaphragm 50 and the second backplate 60 form two conductive terminals of a second capacitive element. The first backplate 30 and the second backplate 60 may comprise a conductive layer. The first backplate 30 and the second backplate 60 may also respectively comprise multiple layers stacked together. For example, the first backplate 30 and the second backplate 60 can respectively comprise a first silicon nitride layer, a second silicon nitride layer and a polysilicon layer disposed between the first silicon nitride layer and the second silicon nitride layer. An electrical contact 82 is electrically connected to the second backplate 60 that forms a first terminal for a capacitive element, and an electrical contact 84 electrically connected to the diaphragm 50 that forms a second terminal for the capacitive element. In addition, the MEMS microphone 95 can include one or more contacts (e.g., a contact 86) that connect to pre-fabricated CMOS circuits (not shown in the figure) on the substrate through via holes. The pre-fabricated CMOS circuits can provide the electronics for supporting the operation of the MEMS microphone 95.

FIGS. 4-15 are cross-sectional views showing a method of manufacturing a MEMS microphone that has a diaphragm with a sidewall stopper in accordance with some embodiments.

Figure 4:
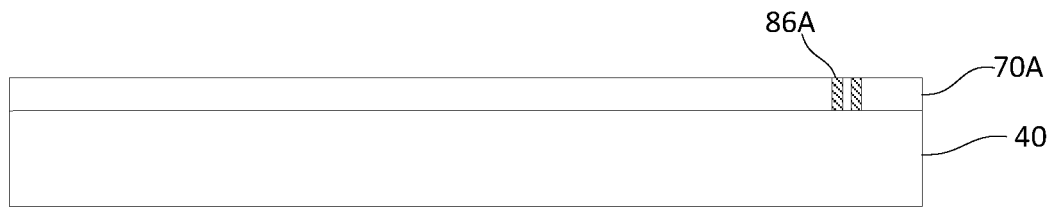
FIGS. 4-15 illustrate a series of cross-sectional views of a MEMS microphone that has a diaphragm with a sidewall stopper at various stages of manufacture in accordance with some embodiments.

As shown in a cross-sectional view in FIG. 4, a connecting structure 86A and a dielectric layer may be formed over a substrate 40. In various embodiments, the substrate 40 can be, for example, silicon, glass, silicon dioxide, aluminium oxide, or the like. The dielectric layer 70A can be an oxide material (e.g., SiO2). In some embodiments, the dielectric layer 70A can be formed by way of a thermal process. In other embodiments, the dielectric layer 70A can be formed by a deposition process, such as, chemical vapor deposition (CVD), physical vapor deposition (PVD), or atomic layer deposition (ALD). The dielectric layer 70A then is patterned according to a masking layer (not shown) to form trenches or via holes for the connecting structure 86A to be formed. For example, a via hole as shown in FIG. 4 can be formed through the dielectric layer 70A. A conductive material may be filled in the trenches or via holes to form the connecting structure 86A within the dielectric layer 70A.

Figure 5:
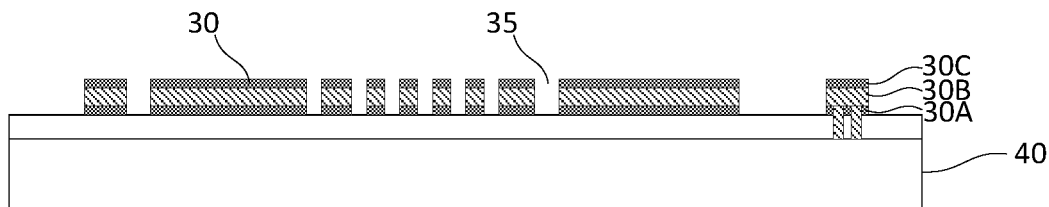

As shown in a cross-sectional view in FIG. 5, a first backplate 30 is formed on the dielectric layer 70A. In some embodiments, the first backplate layer 30 may be formed by depositing a conformal layer of poly-silicon with a suitable deposition technique, such as physical vapor deposition (PVD) or chemical vapor deposition (CVD). In some other embodiments, the first backplate layer 30 includes three layers which are formed by first depositing a layer of silicon nitride 30A, continued by depositing a layer of poly-silicon 30B, and followed by depositing another layer of silicon nitride 30C. Each of these three layers can be formed with PVD, CVD, or any other suitable techniques. After the deposition, the first backplate layer 30 is patterned according to a masking layer (not shown) to form a first backplate 30 including multiple open areas 35.

Figure 6:
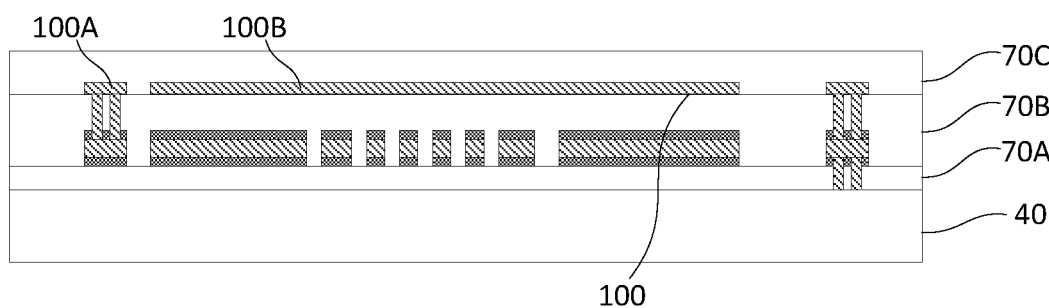

As shown in a cross-sectional view in FIG. 6, a diaphragm layer 100 is formed over the first backplate 30 and spaced apart from the first backplate 30 by a first interlayer dielectric layer 70B. In some embodiments, the first interlayer dielectric layer 70B is an oxide layer and is deposited over the first backplate 30 and the dielectric layer 70A followed by a planarization process. The diaphragm layer 100 may be deposited on top of the first interlayer dielectric layer 70B with a suitable technique, such as chemical vapor deposition (CVD), followed by a first patterning process. The first patterning process may be performed to etch the diaphragm layer 100 to discrete portions. For example, the first patterning process may be performed to etch the diaphragm layer 100 to form a first portion 100A coupled to the connecting structure 86A discretely from a second portion 100B. In some embodiments, the diaphragm layer 100 can be made of polysilicon. Then, a second interlayer dielectric layer 70C is formed over the diaphragm layer 100. As an example, the first interlayer dielectric layer 70B may be a silicon oxide layer. The first interlayer dielectric layer 70B may have a thickness in a range of from about 1 μm to about 3 μm. The second interlayer dielectric layer 70C may be a silicon oxide layer. The second interlayer dielectric layer 70C may have a thickness in a range of from about 0.05 μm to about 1 μm.

Figure 7:
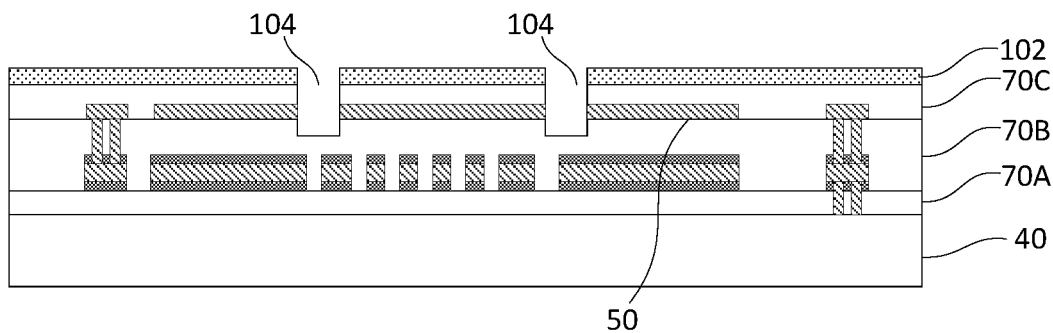

As shown in a cross-sectional view in FIG. 7, a masking layer 102 is formed over the second interlayer dielectric layer 70C and an opening 104 is formed according to the masking layer 102. In some embodiments, the masking layer can include photoresist or a nitride (e.g., $Si_3N_4$) patterned using a photolithography process. The opening 104 may be formed by a first etching process. In some embodiments, an etchant used by the first etching process can include a dry etchant having an etching chemistry comprising a fluorine species (e.g., $CF_4$, $CHF_3$, $C_4F_8$, etc.). In some embodiments, the etchant can include a wet etchant, such as, hydrofluoric acid (HF), buffered oxide etch (BOE) solution, or tetramethylammonium hydroxide (TMAH). The opening 104 may be formed through the second interlayer dielectric layer 70C and the diaphragm layer 100 and reaching into an upper portion of the first interlayer dielectric layer 70B. A depth of the opening 104 is controlled by the first etching process to decide a height of a sidewall stopper to be formed in some subsequent process steps. As an example, the upper portion of the first interlayer dielectric layer 70B may have a height in a range of from about 0.05 μm to about 1 μm. A remaining depth of the first interlayer dielectric layer 70B below the opening 104 may be in a range of from about 0.5 μm to about 2.95 μm.

Figure 8:
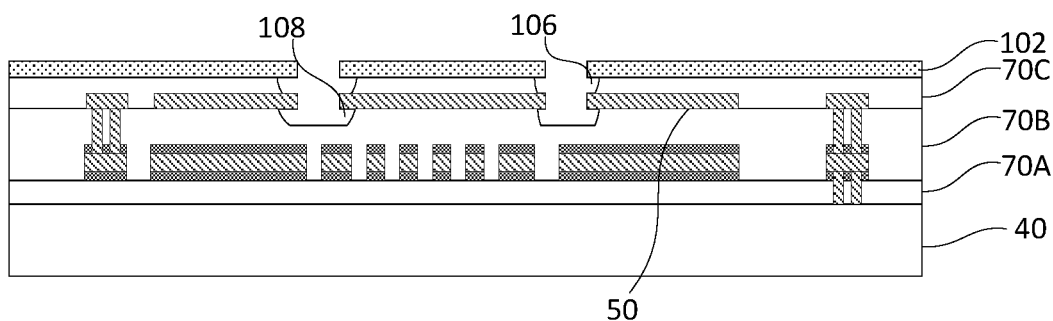

As shown in a cross-sectional view in FIG. 8, a second etching process is performed to the second interlayer dielectric layer 70C to form a first recess 106 above the diaphragm 50 and to expose a portion of a top surface of the diaphragm 50. The second etching process is also performed to the first interlayer dielectric layer 70B to form a second recess 108 below the diaphragm 50 and to expose a portion of a bottom surface of the diaphragm 50. The second etching process may be performed with the masking layer 102 in place. The second etching process comprises a wet etch that is selective to the first interlayer dielectric layer 70B and the second interlayer dielectric layer 70C relative to the diaphragm 50, more specifically, the wet etch has an etching rate to the first interlayer dielectric layer 70B and the second interlayer dielectric layer 70C at least 20 times greater than an etching rate to the diaphragm 50. Lateral dimensions of the first recess 106 and the second recess 108 are controlled by the second etching process to decide a thickness (i.e., a lateral dimension) of the sidewall stopper to be formed in some subsequent process steps. As an example, the lateral dimensions of the first recess 106 and the second recess 108 may be in a range of from about 0.05 μm to about 1 μm.

Figure 9:
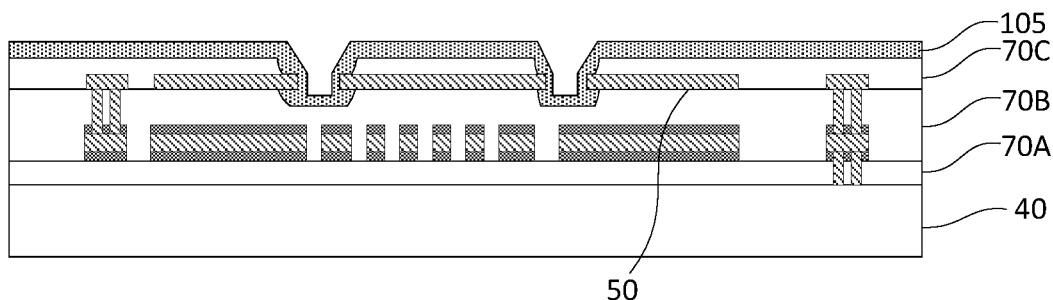

As shown in a cross-sectional view in FIG. 9, a conformal dielectric layer 105 is formed on the second interlayer dielectric layer 70C and extended downwardly to sidewalls of the second interlayer dielectric layer 70C, the diaphragm 50, and the upper portion of the first interlayer dielectric layer 70B and the laterally to an upper surface of the first interlayer dielectric layer 70B. The conformal dielectric layer 105 may be formed by a suitable deposition technique such as a PVD process or a CVD process. The conformal dielectric layer 105 may be a silicon nitride layer. The conformal dielectric layer 105 may have a thickness in a range of from about 0.1 μm to about 2 μm.

Figure 10:
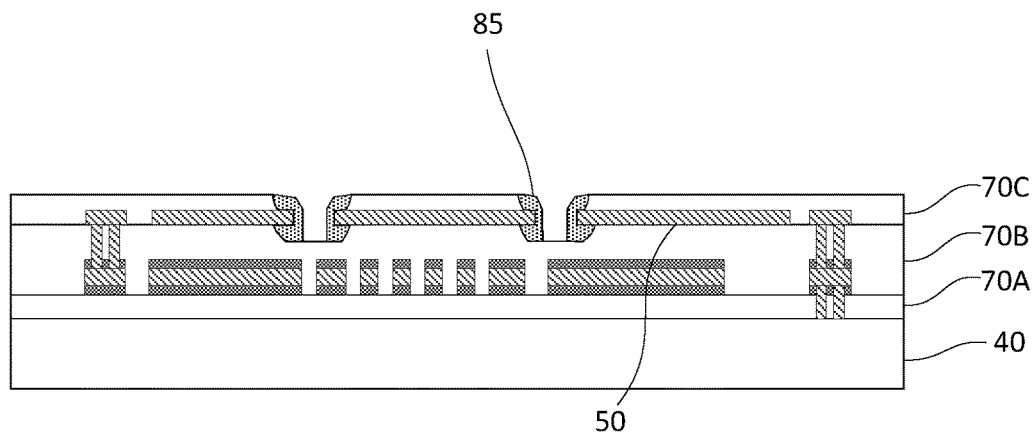

As shown in a cross-sectional view in FIG. 10, a third etching process is performed to the conformal dielectric layer 105 (shown in FIG. 9) to form the sidewall stopper 85 alongside the sidewalls of the second interlayer dielectric layer 70C, the diaphragm 50, and the upper portion of the first interlayer dielectric layer 70B. The third etching process is an anisotropic etching process, such as a vertical etch that removes lateral portions and to leaves vertical portions of the conformal dielectric layer within the recesses 106, 108 of the first interlayer dielectric layer and the second interlayer dielectric layer (shown in FIG. 8) and alongside the sidewall of the diaphragm 50. In some embodiments, an etchant used by the third etching process can include a dry etchant having an etching chemistry comprising a fluorine species (e.g., CF4, CHF3, C4F8, etc.).

Figure 11:
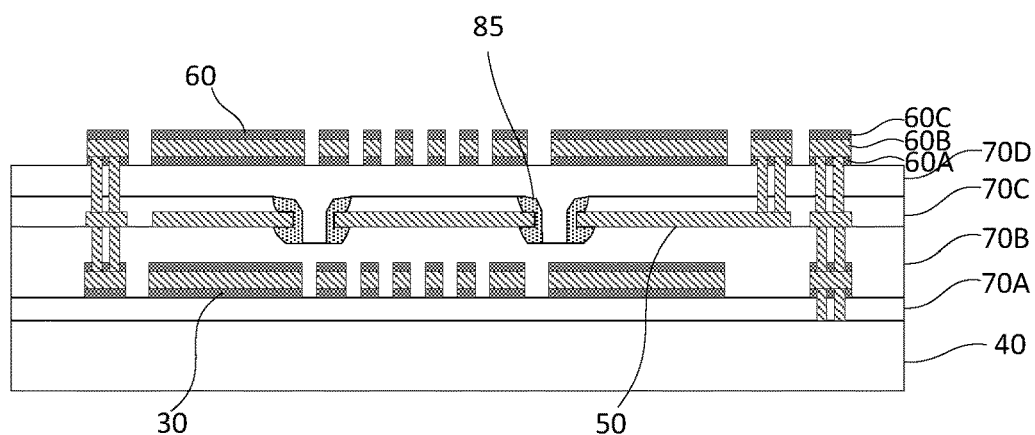

As shown in a cross-sectional view in FIG. 11, an upper dielectric layer 70D is formed over the second interlayer dielectric layer 70C and the sidewall stopper 85. A second backplate 60 is formed over the upper dielectric layer 70D. The second backplate 60 may be made of the same or different material than the first backplate 30. In some embodiments, the second backplate 60 may be formed by depositing a conformal conductive layer or a plurality of layers including a conductive layer such as a layer of silicon nitride 60A, a layer of poly-silicon 60B, and another layer of silicon nitride 60C followed by a patterning process. Each of these layers can be formed with PVD, CVD, or any other suitable techniques.

Figure 12:
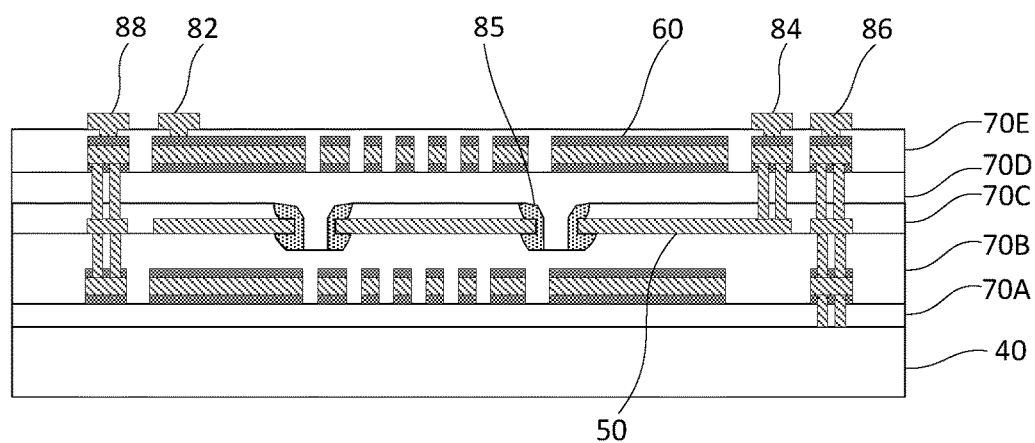

As shown in a cross-sectional view in FIG. 12, a plurality of contacts 82, 84, 86, 88 are formed over the upper dielectric layer 70D. The contacts may be formed by depositing a contact layer is followed by a patterning process. Examples of the materials for forming the contacts include silver, gold, copper, aluminum, aluminum-copper alloy, gold-copper alloy or other suitable conductive materials. The lower dielectric layer 70A, the first interlayer dielectric layer 70B, and the second interlayer dielectric layer 70C, and the upper dielectric layer 70D collectively form an interlayer dielectric layer (see an interlayer dielectric layer 70 shown in FIG. 2, FIG. 3, or FIG. 15) that provide electrical isolation and mechanical supports for various components on the substrate 40.

Figure 13:
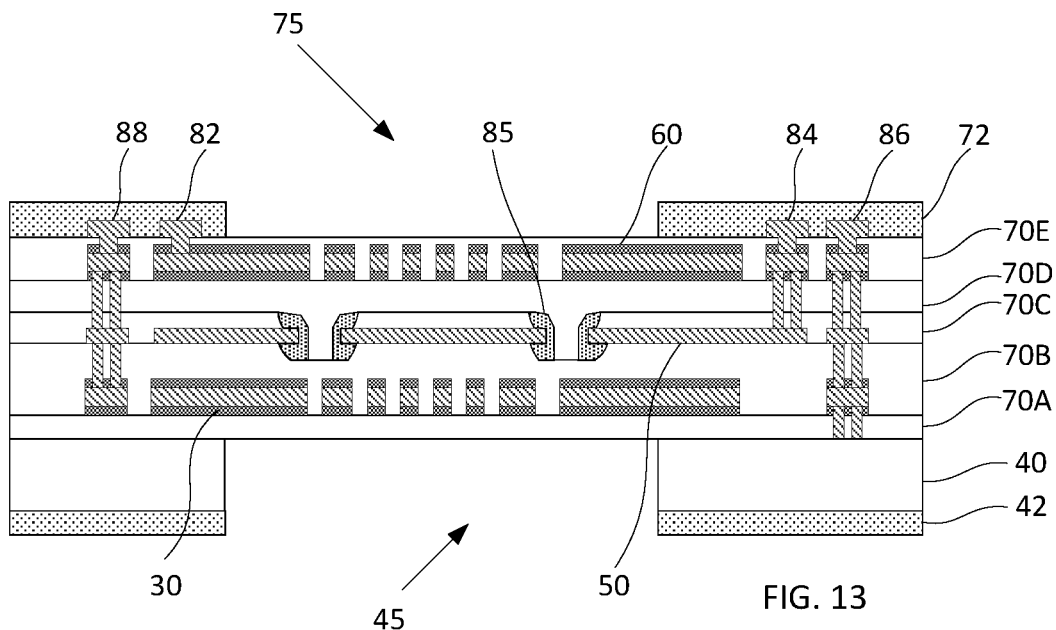

As shown in a cross-sectional view in FIG. 13, a first protection layer 72 is formed and patterned to form a first opening 75 through the first protection layer 72 and overlying the diaphragm 50. A second protection layer 42 is deposited on the substrate 40. Example protection layers for the first protection layer 72 and the second protection layer 42 include a photoresists layer or a dielectric material layer (e.g., silicon nitride). Some areas of the second protection layer 42 are removed to form a protection mask on the substrate 40 that opens up selected parts of the substrate 40 for an etching process. The substrate 40 is patterned to form a second opening 45 through the substrate 40 at a position corresponding to the diaphragm 50. In some embodiments, the opening 45 on the substrate 40 can be opened up by anisotropic plasma etching.

Figure 14:
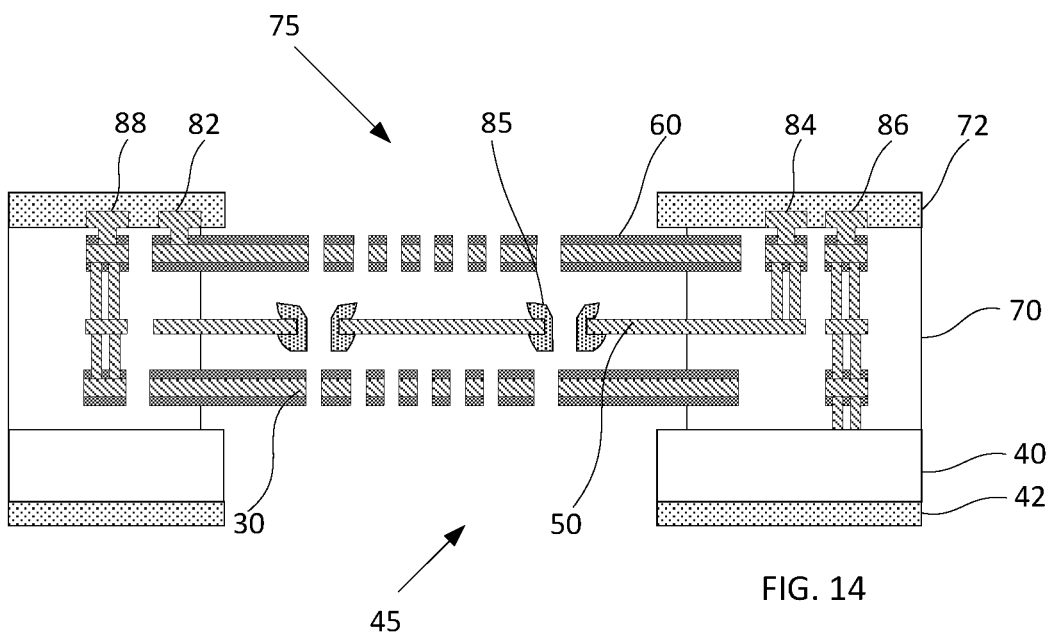

As shown in a cross-sectional view in FIG. 14, an etch is performed to release the diaphragm 50 to be movable relative to the first backplate 30 and the second backplate 60. The interlayer dielectric layer 70 is etched with a wet etchant, starting from both the opening 45 on the substrate 40 and the opening 75 on the interlayer dielectric layer 70, to form the diaphragm 50 and possibly the suspended backplate 60. Examples of the wet etchant that can be used for etching the interlayer dielectric layer 70 include hydrofluoric acid (HF), Buffered Oxide Etch (BOE) solution (6 parts 40% NH4F and 1 part 49% HF), or Tetramethylammonium hydroxide (TMAH)). Thus the diaphragm 50 is configured to deflect under an air pressure when the air pressure is larger or smaller than a predetermined value. The sidewall stopper 85 is configured to protect the diaphragm 50 from stick to the first backplate 30 and/or the second backplate 60.

Figure 15:
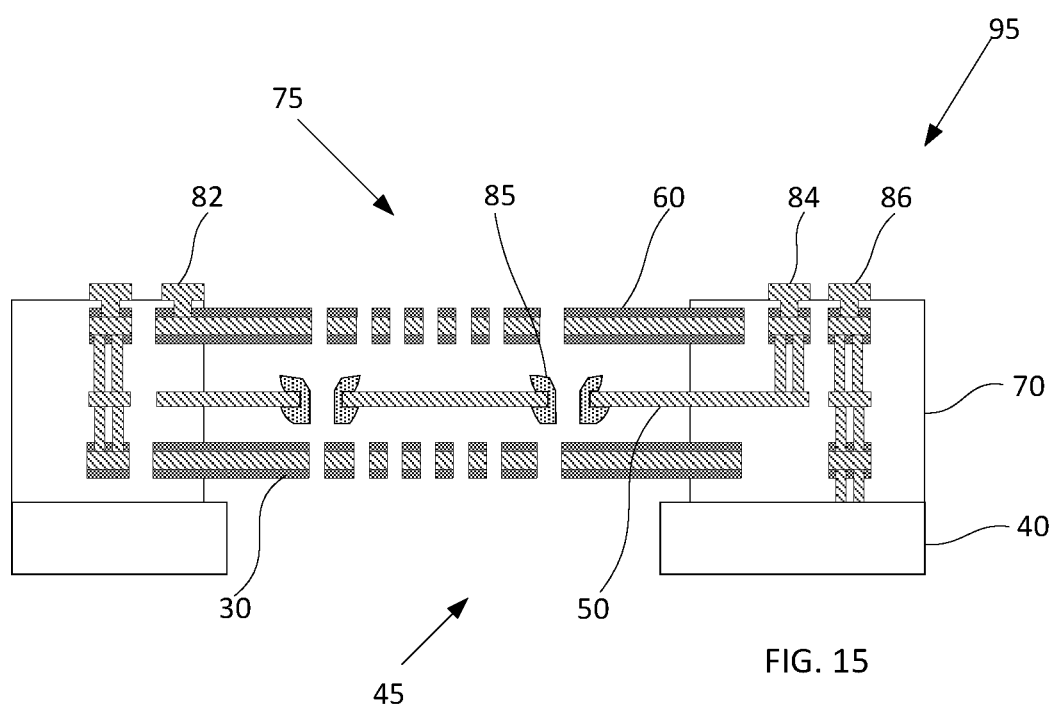

As shown in a cross-sectional view in FIG. 15, both the first protection layer 72 and the second protection layer 42 are removed. These protection layers can be stripped off with chemicals or etched away with etchant. After removing these protection layers, the MEMS microphone 95 having the diaphragm 50 with a sidewall stopper 85 is fabricated. The MEMS microphone 95 as fabricated includes an electrical contact 82 electrically connected to the backplate 60 that forms a first terminal for the capacitive element, and an electrical contact 84 electrically connected to the diaphragm 50 that forms a second terminal for the capacitive element. In addition, the MEMS microphone 95 can include one or more contacts (e.g., a contact 86, the only one shown in the figure) that connect to pre-fabricated CMOS circuits (not shown in the figure) on the substrate through via holes. The pre-fabricated CMOS circuits can provide the electronics for supporting the operation of the MEMS microphone 95. In some embodiments, the pre-fabricated CMOS circuits can be fabricated, using suitable process, on the substrate 40 before the lower dielectric layer 70A is formed on the substrate 40 (as shown in FIG. 4).

Figure 16:
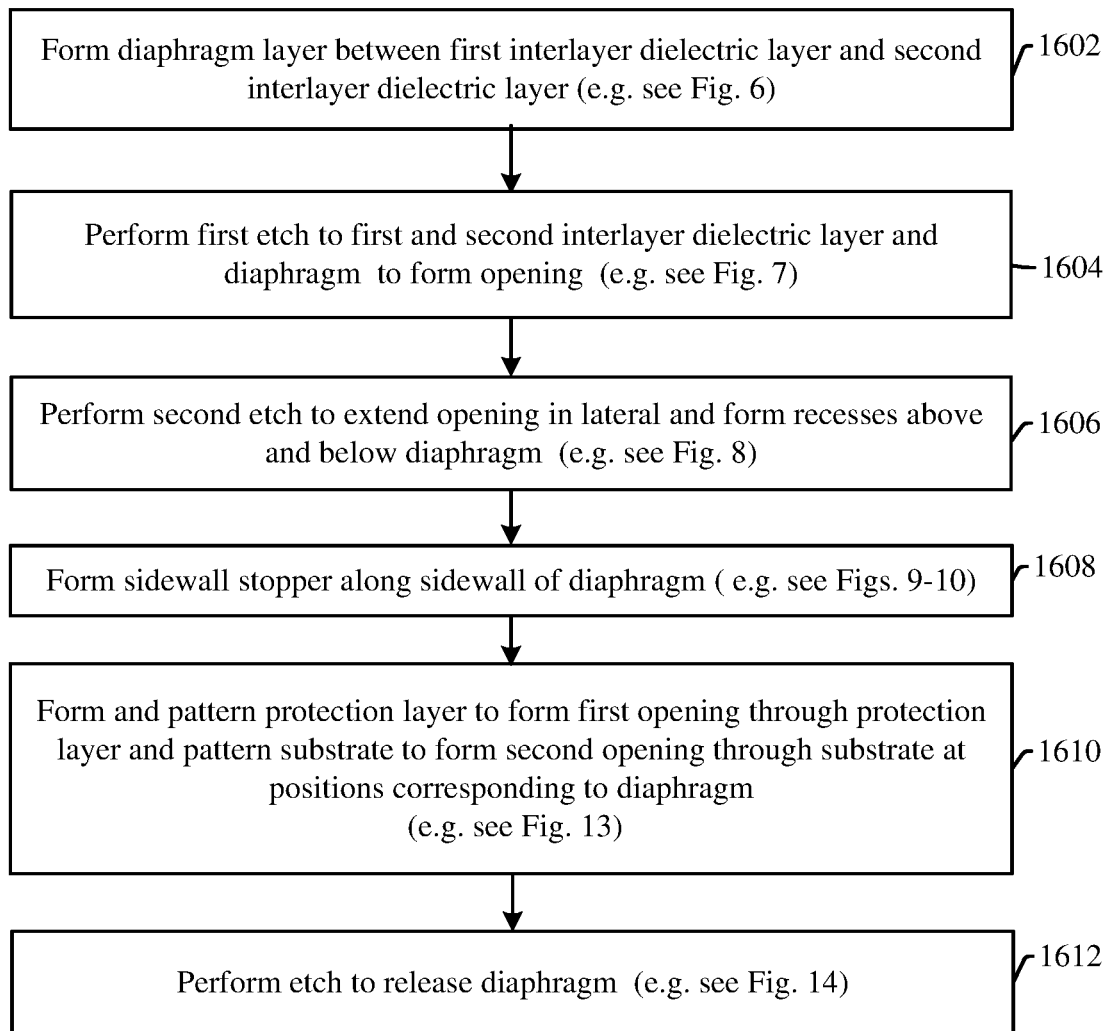
FIG. 16 illustrates a flow diagram of a method for manufacturing a MEMS microphone in accordance with some embodiments.

FIG. 16 illustrates a flow diagram of a method for manufacturing a MEMS device in accordance with some embodiments. The MEMS device includes a sidewall stopper clamped on edges of openings of a movable diaphragm to provide stiction protection to the movable diaphragm. Examples of the MEMS device are shown in FIGS. 4-15. Although FIGS. 4-15 are described in relation to the method shown in FIG. 16, it will be appreciated that the structures disclosed in FIGS. 4-15 are not limited to the method shown in FIG. 16, but instead may stand alone as structures independent of the method shown in FIG. 16. Similarly, although the method shown in FIG. 16 is described in relation to FIGS. 4-15, it will be appreciated that the method shown in FIG. 16 is not limited to the structures disclosed in FIGS. 4-15, but instead may stand alone independent of the structures disclosed in FIGS. 4-15. Also, while disclosed methods (e.g., the method shown in FIG. 16) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a semiconductor substrate is provided and a diaphragm layer is formed between first interlayer dielectric layer and second interlayer dielectric layer. See, for example, as shown by a cross-sectional view shown in FIG. 6.

At act 1604, a first etch is performed to the first interlayer dielectric layer, the diaphragm and the second interlayer dielectric layer to form an opening. See, for example, as shown by a cross-sectional view shown in FIG. 7.

At act 1606, a second etch is performed to extend the opening in lateral and form recesses above and below the diaphragm. See, for example, as shown by a cross-sectional view shown in FIG. 8.

At act 1608, a sidewall stopper is formed along a sidewall of the diaphragm. See, for example, as shown by a cross-sectional view shown in FIGS. 9-10.

At act 1610, a protection layer is formed and patterned to form a first opening through the protection layer. The substrate is patterned to form a second opening through the substrate at positions corresponding to the diaphragm. See, for example, as shown by a cross-sectional view shown in FIG. 13.

At act 1612, an etch is performed to release the diaphragm. See, for example, as shown by a cross-sectional view shown in FIG. 14.

Thus, as can be appreciated from above, the present disclosure relates to a MEMS device and associated methods. Though the above description uses a MEMS microphone as an example, the disclosed sidewall stopper can be implemented in varies MEMS devices. In those devices, the sidewall stopper is clamped to edges of an opening (a venting hole or other opening structures) partially or thoroughly disposed within a movable diaphragm of a MEMS device). The sidewall stopper is used to protect the movable diaphragm from stiction. The sidewall stopper locates alongside a sidewall of the opening and may vertically extend above and/or below the movable diaphragm and laterally extend across an edge of the opening of the diaphragm.

In some embodiments, the present disclosure relates a microphone. The microphone includes a diaphragm, a backplate, and a sidewall stopper. The diaphragm has a venting hole disposed therethrough. The backplate is disposed over and spaced apart from the diaphragm. The sidewall stopper is disposed along a sidewall of the diaphragm exposing to the venting hole.

In other embodiments, the present disclosure relates to a MEMS device. The MEMS device includes a substrate having an opening disposed therethrough and a diaphragm disposed over the substrate. The diaphragm overlies the opening and comprises a venting hole disposed therethrough. The MEMS device further has a sidewall stopper disposed along a sidewall of the venting hole.

In yet other embodiments, the present disclosure relates to a MEMS device. The MEMS device includes a diaphragm and a sidewall stopper. The sidewall stopper is disposed along a sidewall of the diaphragm and laterally extends along an upper surface and a lower surface of the diaphragm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microphone, comprising:
a diaphragm having a venting hole disposed therethrough;
a backplate disposed over and spaced apart from the diaphragm; and
a sidewall stopper disposed along a sidewall of the diaphragm exposing to the venting hole.

2. The microphone of claim 1,
wherein the sidewall stopper laterally extends across an edge of the venting hole and includes an upper portion contacting a top surface of the diaphragm and a lower portion contacting a bottom surface of the diaphragm; and
wherein the upper portion and the lower portion of the sidewall stopper clamp a middle portion of the diaphragm therebetween.

3. The microphone of claim 2, wherein the upper portion and the lower portion of the sidewall stopper have curved sidewalls.

4. The microphone of claim 1, wherein the sidewall stopper has an upper portion higher than a top surface of the diaphragm and a lower portion lower than a bottom surface of the diaphragm.

5. The microphone of claim 1, further comprising a substrate having an opening disposed through the substrate, wherein the diaphragm is disposed over the substrate and facing the opening of the substrate.

6. The microphone of claim 1, wherein a height of the sidewall stopper is greater than a distance between the backplate and the diaphragm when the diaphragm is in a relax position.

7. The microphone of claim 1, wherein the backplate comprises a first silicon nitride layer, a second silicon nitride layer and a polysilicon layer disposed between the first silicon nitride layer and the second silicon nitride layer.

8. The microphone of claim 1, wherein the sidewall stopper comprises silicon nitride.

9. The microphone of claim 1, wherein the sidewall stopper comprises polysilicon.

10. A MEMS device, comprising:
a substrate having an opening disposed through the substrate;
a diaphragm disposed over the substrate and overlying the opening, the diaphragm comprising a venting hole disposed therethrough; and
a sidewall stopper disposed along a sidewall of the venting hole.

11. The MEMS device of claim 10, wherein the sidewall stopper has a ring shape that continuously extends along a perimeter of the opening of the diaphragm.

12. The MEMS device of claim 10, wherein the sidewall stopper covers the sidewall of the venting hole.

13. The MEMS device of claim 10, further comprising:
a first backplate and a second backplate disposed at opposite sides of the diaphragm;
wherein the diaphragm is spaced apart from the first backplate by a first distance and spaced apart from the second backplate by a second distance.

14. The MEMS device of claim 13, wherein the first backplate and the second backplate respectively comprises a first silicon nitride layer, a second silicon nitride layer and a polysilicon layer disposed between the first silicon nitride layer and the second silicon nitride layer.

15. The MEMS device of claim 10, wherein the sidewall stopper laterally extends across a boundary edge of the venting hole and disposed along an upper surface and a lower surface of the diaphragm.

16. A MEMS device, comprising:
a diaphragm having an opening disposed therethrough; and
a sidewall stopper disposed within the opening along a sidewall of the diaphragm and laterally extending along and contacting an upper surface and a lower surface of the diaphragm.

17. The MEMS device of claim 16, further comprising:
a first interlayer dielectric layer and a second interlayer dielectric layer disposed at opposite sides of the diaphragm;

wherein the sidewall stopper extends into recesses of the first interlayer dielectric layer and the second interlayer dielectric layer above and below the diaphragm.

18. The MEMS device of claim 17, wherein a portion of a top surface of the diaphragm directly contacts the first interlayer dielectric layer.

19. The MEMS device of claim 17, wherein a portion of a bottom surface of the diaphragm directly contacts the second interlayer dielectric layer.

20. The MEMS device of claim 17, further comprising:
a first backplate disposed on the first interlayer dielectric layer; and
a second backplate disposed under the second interlayer dielectric layer.

* * * * *